(12) United States Patent
Charles et al.

(10) Patent No.: US 8,924,633 B2
(45) Date of Patent: Dec. 30, 2014

(54) METHODS AND SYSTEM FOR ERASING DATA STORED IN NONVOLATILE MEMORY IN LOW POWER APPLICATIONS

(75) Inventors: Gordon Alexander Charles, Sunnyvale, CA (US); Maxim Moiseev, Santa Clara, CA (US); Jonathan Simon, Castro Valley, CA (US)

(73) Assignee: Dust Networks, Inc., Hayward, CA (US)

( * ) Notice: Subject to any disclaimer, the term of this patent is extended or adjusted under 35 U.S.C. 154(b) by 350 days.

(21) Appl. No.: 13/415,548

(22) Filed: Mar. 8, 2012

(65) Prior Publication Data

US 2012/0233384 A1    Sep. 13, 2012

Related U.S. Application Data

(60) Provisional application No. 61/450,516, filed on Mar. 8, 2011.

(51) Int. Cl.
*G06F 13/18* (2006.01)
*F15B 11/036* (2006.01)
*G11C 16/16* (2006.01)

(52) U.S. Cl.
CPC ............ *F15B 11/0365* (2013.01); *G11C 16/16* (2013.01); *F15B 2211/7055* (2013.01)
USPC ............ 711/103; 711/154; 365/218; 365/228

(58) Field of Classification Search
USPC ............................ 711/103, 154; 365/218, 228
See application file for complete search history.

(56) References Cited

U.S. PATENT DOCUMENTS

| 5,001,332 A | 3/1991 | Schrenk |
| 6,515,919 B1 | 2/2003 | Lee |
| 2004/0213068 A1* | 10/2004 | Matsue .......................... 365/226 |
| 2006/0248269 A1* | 11/2006 | Shona ........................... 711/103 |
| 2007/0233752 A1 | 10/2007 | Bangalore et al. |
| 2009/0066483 A1 | 3/2009 | Naura et al. |
| 2010/0023679 A1* | 1/2010 | Blum ............................ 711/103 |

OTHER PUBLICATIONS

Krishnaswamy Ramkumar, "Cypress Semiconductor White Paper," Cypress SONOS Technology, Jul. 6, 2011, pp. 1-9.
Extended European Search Report issued in European Patent Application No. 12001597.9 dated Jan. 25, 2013.
Partial European Search Report issued in European Patent Application No. 12001597.9 dated Sep. 14, 2012.
Chinese Notification of Entry into Substantive Examination Phase, w/ English translation thereof, issued in Chinese Patent Application No. CN 201210060423.3 dated Jan. 24, 2014.

* cited by examiner

*Primary Examiner* — Jae Yu
(74) *Attorney, Agent, or Firm* — McDermott Will & Emery LLP

(57) ABSTRACT

The erasing of data stored in a nonvolatile memory is performed using multiple partial erase operations. Each partial erase operation has a time duration that is shorter than the minimum time duration of an erase operation that is needed to reliably erase the data stored in the storage location. However, the sum of the time durations of the multiple partial erase operations is sufficient to reliably erase the data in the storage location. In one example, during a partial erase operation, a voltage is applied to a memory storage transistor to remove some, but not necessarily all, of the charge stored on a charge storage layer of the transistor. Following multiple partial erase operations, sufficient charge is removed from the charge storage layer to ensure reliable data erasure.

23 Claims, 8 Drawing Sheets

METHODS AND SYSTEM FOR ERASING DATA STORED IN NONVOLATILE MEMORY IN LOW POWER APPLICATIONS

CROSS REFERENCE TO RELATED APPLICATION

The present application claims the benefit of priority from U.S. Provisional Patent Application Ser. No. 61/450,516, entitled "NONVOLATILE MEMORY USE IN LOW POWER APPLICATIONS" and filed on Mar. 8, 2011, which is hereby incorporated by reference in its entirety for all purposes.

BACKGROUND

Nonvolatile memories (NVM) provide flexible and low-cost data storage for many applications such as personal music devices, digital cameras, and computer hard drives. Many of these memories are both writable and erasable, allowing data to be changed post manufacture, in the field.

The writing and erasing of these memories often have different current profiles with one operation requiring substantially higher current than the other. Furthermore, one of the two operations often takes substantially longer than the other operation. As an illustrative example, the MSP430F543XA microcontroller from Texas Instruments includes a 192 kB flash memory configured into pages. According to the MSP430F543XA datasheet (SLAS655B—JANUARY 2010—REVISED OCTOBER 2010), erasing a 512B page requires up to 2 mA of current from 1.8V for 32 ms for a total required energy of about 115.2 uJ. However, writing a byte of memory may be done for much less energy: 5 mA from 1.8V for 85 us for a total required energy of 0.77 uJ.

In general, storing a new value in NVM requires both a write and an erase operation; thus, the minimum energy required to change the value is set by whichever is greater: write energy or erase energy. In applications where available energy is limited (e.g., a scavenged power supply) it is often not possible to meet both the write and erase energy requirements using existing technology.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. A processor described as having programming which configures the processor to perform functions includes a processor configured to perform functions based on machine readable instructions stored in a machine-readable medium (such as a non-transitory medium), as well as a processor storing instructions as in a finite state machine (FSM). In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Changing a value in a nonvolatile memory is disclosed. In some embodiments, the nonvolatile memory is part of a larger system powered by a scavenged power supply, another type of limited power supply, or the like. In some embodiments, the nonvolatile memory is part of a system that includes a radio for communicating information to a remote location.

Figure 1:
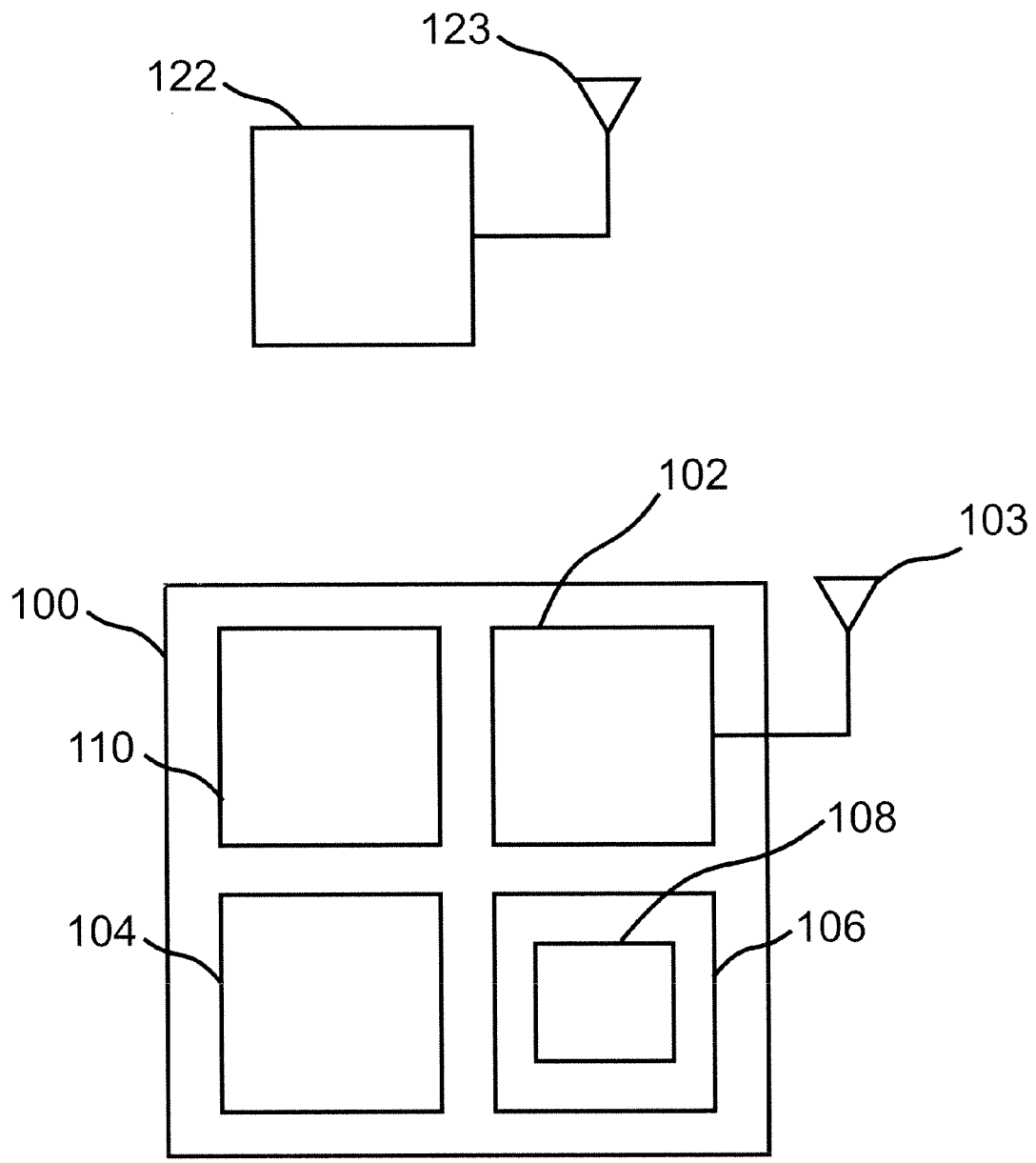
FIG. 1 is a block diagram illustrating an embodiment of a system with nonvolatile memory.

FIG. 1 is a block diagram illustrating an embodiment of a system with nonvolatile memory. In the example shown, system 100 includes a nonvolatile memory 110, radio 102, processor 104, and energy source 106. Radio 102 is connected to antenna 103 which in various embodiments comprises a dipole antenna, a chip antenna, an antenna fabricated by patterning traces on a printed circuit board, or any other appropriate structure for transmitting or receiving electromagnetic waves. In some embodiments, nonvolatile memory 110 comprises a NAND Flash memory, a NOR Flash memory, or a charge trap based memory (e.g., Silicon-Oxide-Nitride-Oxide-Silicon (SONOS) based flash memory). In various embodiments, nonvolatile memory 110 includes electrically erasable programmable read-only memory (EEPROM), magnetoresistive random access memory (MRAM), ferroelectric RAM (FRAM), phase-change memory (PRAM), or any other appropriate nonvolatile memory. Radio 102 includes a transmitter for transmitting data from system 100 to a radio 122 at a remote location. Radio 122 is coupled to antenna 123. In some embodiments radio 102 also includes a receiver to receive data from radio 122. In various embodiments radio 122 sends an acknowledgment that a packet was received from radio 102; configuration data such as identification of a channel for use in further communications; provisioning data; or any other appropriate data.

In some embodiments Radio 102 transmits a data packet according to techniques established by the Institute of Electrical and Electronics Engineers (IEEE) standard 802.15.4 (2003) or IEEE 802.15.4 (2006). In various embodiments radio 102 transmits a data packet using any of the various IEEE 802.11 protocols; ultra-wideband communication (UWB); Bluetooth; Bluetooth Low Energy; proprietary protocols using frequency, amplitude, and phase modulation or a combination thereof; or any other appropriate method of radio communication. In some embodiments a quartz crystal is used in a reference oscillator for the radio transmitter to ensure that the radio transmits or receives at the desired channel center frequency.

In some embodiments system 100 is used as a light switch, transmitting a data packet to a remote location indicating a light should be turned on, turned off, or that the brightness should be adjusted. In some embodiments system 100 is used as part of a system as specified by the ZigBee Draft Standard: Draft ZigBee Green Power Specification (ZigBee Document number 095499).

In some embodiments energy source 106 incorporates an energy harvester 108 that outputs electrical energy. Energy source 106 can optionally include an energy storage unit such as a battery, a capacitor, or the like, which may store energy harvested by energy harvester 108. Energy harvester 108 derives its energy from external sources via a transducer. A transducer is a device that converts one type of energy to another. The conversion can be between electrical, mechanical, magnetic, photonic, photovoltaic, or any other form of energy. In some embodiments energy harvester 108 derives its energy from mechanical energy (e.g. pushing a button, flipping a switch, or rotating a dial) via changing a magnetic field coupled to a coil (e.g. an electrodynamic energy converter as may be found in EnOcean's ECO 100 motion converter). In some embodiments energy harvester 108 derives its energy from mechanical energy through a piezoelectric transducing element (e.g. a piezoelectric ceramic such as PZT or a quartz crystal). In some embodiments vibrational energy (e.g. from imbalances in a motor) is converted to electrical energy using a magnet proximate a coil, the vibrational energy causing relative motion of the magnet and coil. In some embodiments thermal energy is converted to electrical energy for example via a Peltier device (e.g. EnOcean's ECT 310 Thermo converter) or a device using the Seebeck effect such as a thermocouple. In various embodiments energy harvester 108 derives electrical energy from wind energy, salinity gradients, kinetic energy, a capacitive transducer, a magnetic transducer, a piezoelectric transducer, a thermoelectric transducer, a photovoltaic transducer, a radio frequency transducer (e.g. an antenna coupled to a rectifier and a capacitor used to convert incident RF energy at an antenna or coil to electrical energy usable by an integrated circuit), an electrochemical transducer, or any other appropriate transducer. In some embodiments a capacitor or electrochemical battery is coupled to the transducer to store energy for later use.

In some embodiments energy source 106 incorporates an energy harvester that derives its energy by removing energy from a 4-20 mA current loop. Although a 4-20 mA current loop may be considered line powered, only a certain amount of energy may be extracted from any point in the loop before communication integrity is adversely affected.

In some embodiments processor 104 is coupled to nonvolatile memory 110 and coupled to radio 102 via a printed circuit board connecting three discrete components. In some embodiments one or more of processor 104, radio 102, and nonvolatile memory 110 are integrated on a single piece of silicon providing for lower power consumption and smaller system size. In some embodiments one or more of the processor, radio, and nonvolatile memory are packaged together in a packaging technology such as system-in-package (SIP), or with the aid of a low-temperature co-fired ceramic technology (LTCC).

In some embodiments nonvolatile memory is used to store or maintain a number used once (NONCE) in conjunction with encryption as part of a security protocol such as RFC2617. A NONCE is useful in preventing replay attacks. In some embodiments nonvolatile memory is used to maintain a number used once (NONCE) in conjunction with encryption as part of a security protocol such as described in Draft ZigBee Green Power Specification (ZigBee Document number 095499), section A.1.5.4.1 Constructing AES Nonce. A security protocol is helpful in preventing unauthorized users from communicating with or eavesdropping on communications. Maintaining a valid NONCE relies on knowledge of prior nonce values, and may therefore rely on storing prior nonce values in a memory. Non-volatile memory is particularly well suited for NONCE storage in applications where system power is intermittent.

Figure 8:
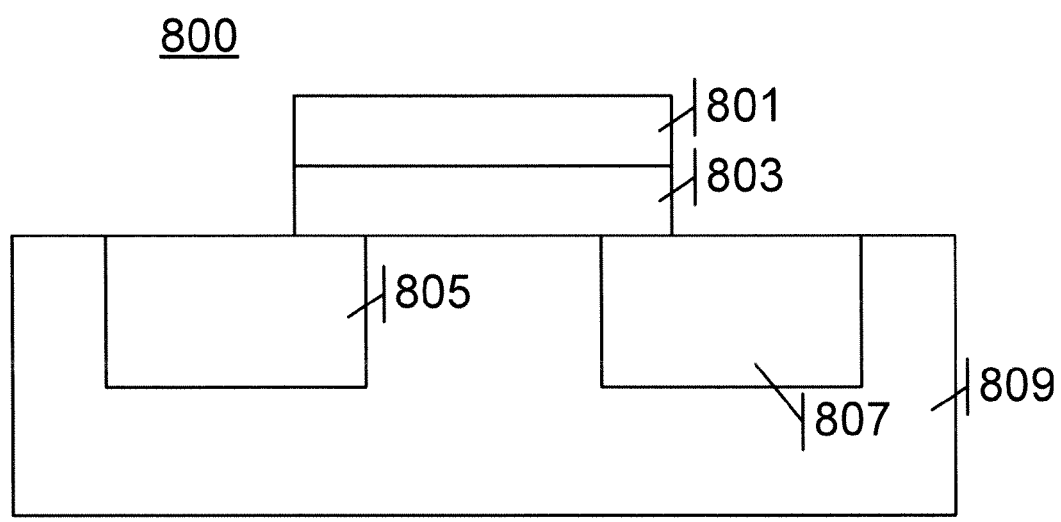
FIG. 8 is a cross section of an exemplary memory storage transistor that can be used as part of the nonvolatile memory.

In some embodiments nonvolatile memory 110 is a flash memory. Flash memory uses hot-electron injection to write and store data by injecting electrons onto a charge storage layer (e.g., a floating gate) of a memory storage cell such as a transistor. FIG. 8 shows a cross sectional view of an exemplary memory storage transistor 800 that can be used as part of the nonvolatile memory. Memory storage transistor 800 may be formed in a semiconductor substrate 809, and may include source and drain regions 805 and 807, respectively, formed within the substrate 809. A charge storage layer 803 (such as a floating gate) is formed on a surface of the semiconductor substrate 809 above a region separating the source and drain regions. A control gate 801 is formed above the charge storage layer 803. In some examples, the charge storage layer 803 is a floating gate which is electrically insulated from the control gate 801, while in other examples, the charge storage layer 803 is a charge trap formed of an insulating layer such as silicon nitride in contact with or in close proximity to the control gate 801. In one embodiment, a word line of the non-volatile memory is electrically coupled to the control gate 801, while a source line and a bit line of the non-volatile memory are respectively coupled to the source and drain regions.

In the flash memory example, data is erased by applying a large voltage difference between the control gate 801 and the drain 807 of the transistor to induce quantum tunneling and thereby remove charge (e.g., electrons) from the charge storage layer 803. In general, erasing a storage location (e.g., a memory page) in a flash memory requires that the large voltage difference be applied for a predetermined amount of time between the control gate 801 and the drain 807. The predetermined amount of time can be specified by a manufacturer or vendor of the flash memory, and may correspond to a minimum time duration of an erase operation to ensure that the storage location is reliably erased.

Flash memory is organized into pages or blocks of memory; the size of the page is architecture specific and typically ranges between 128 and 4096 bytes, but sizes bigger or smaller than these values may be encountered. Flash memory may be written in data quanta as small as a bit; however, flash memory is generally erased by erasing an entire page. Erasing a flash page typically sets all the bits to 1's (e.g., by removing all, or substantially all charge stored on charge storage layers of memory storage transistors), and writing a flash bit sets the bit to 0 (e.g., by causing charge to be stored on a charge storage layer of a memory storage transistor, such that the charge stored on the charge storage layer exceeds a threshold amount of charge). If a bit has been programmed to a 0 (or other appropriate logic state) then the whole page may need to be erased to set the bit back to 1 (or an other appropriate logic state). In some embodiments erasing a flash page sets all the bits to 0's and writing a flash bit sets the bit to a 1. In some embodiments, the threshold amount of charge (or other threshold determining the logic state of the memory cell) is measured based on the voltage amplitude or electrical potential of the charge storage layer, and/or based on a current intensity of current flowing through the memory storage transistor. While writing a flash bit takes a small amount of energy, erasing a whole page takes a substantial amount of energy. For example erasing a 2 kB flash page of a particular flash memory may require 6.5 mA of current for 20 ms at 3.6 V, or 468 uJ; writing a 32-bit word may require 10 mA from 1.8V for 20 us, or 0.36 uJ. In many applications the large amount of energy needed for an erase operation is not available. In some embodiments there is sufficient energy to perform a page erase operation, but doing so would leave insufficient energy to perform additional desired tasks, such as communicating with a remote node, storing data in memory, or the like. In some embodiments the amount of energy available to perform a flash erase is less than the energy needed to perform the erase operation.

Figure 2:
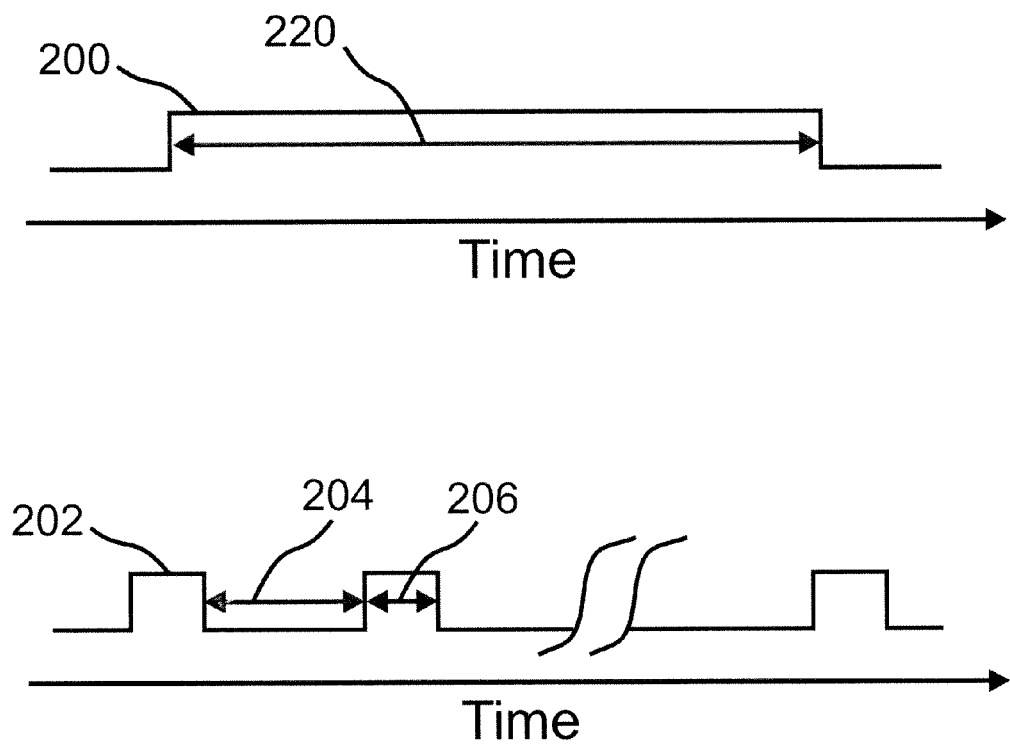
FIG. 2 is a timing diagram illustrating an embodiment of a partial flash erase operation.

FIG. 2 is a timing diagram illustrating embodiments of two different flash erase operations: an upper diagram shows a full flash erase operation 200, while the lower diagram shows a partial flash erase operation 202. In the example shown, full flash erase operation 200 has a time duration equal to 220, and results in full erasure of a page of flash memory at the end of the time period having duration 220. Flash erase operation 200 can be divided into a plurality of partial erase operations 202, with the partial erase operations 202 being separated by a plurality of intervals 204 such that subsequent partial erase operations 202 are separated from each other by a time interval 204 and thus correspond to non-adjoining (and non-overlapping) time periods. In a partial erase operation 202, the flash memory is put into the erase mode for a time period having duration 206. The amount of time that the flash is held in the erase mode is reduced as compared to flash erase operation 200, such that duration 206 is shorter than duration 220. During the partial erase, quantum tunneling starts to erase the flash memory cell during each time period having duration 206 by removing charge (e.g., electrons) from the memory cell, but each partial erase operation does not erase the data completely (i.e., some charge, but not necessarily all charge, is removed from the memory cell). Repeating the partial erase for a number of cycles can provide enough cumulative time, measured as the sum of durations 206 of the time periods during which a partial erase operation is performed, for quantum tunneling to fully erase the memory cell by removing a sufficient amount of charge to ensure the memory cell remains reliably in the erased state.

A full flash erase 200 operation is generally performed by concurrently applying a first voltage or a first current between a control gate and a drain of a memory cell during a time duration 220. The first voltage may have a first voltage amplitude, and the first current may have a first current intensity. A partial flash erase operation 220 is generally performed by applying a second voltage or a second current between the control gate and the drain of the memory cell during a series of multiple time durations 206. In some examples, the second voltage has the same first voltage amplitude, or the second current has the same first current intensity as used in a full flash erase operation 200. However, in other examples, the second voltage may have a higher or a lower amplitude than the first voltage, and the second current may have a higher or a lower current intensity than the first current. In general, the amplitude of the second voltage is the same for all time durations 206 that are part of a partial flash erase operation 202, and the intensity of the second current is the same for all time durations 206 that are part of the partial flash erase operation 202. However, in some examples, the amplitude of the second voltage and/or the intensity of the second current may vary between different time durations 206 of a partial flash erase operation 202.

In some embodiments the partial erase operations occur when a light switch is pressed thereby activating an energy harvester; intervals 204 may represent the time between light switch presses. In some embodiments, the partial erase operations occur when sufficient ambient light is received by a photovoltaic energy harvester to power a partial erase operation; intervals 204 may represent time between light exposures. In other embodiments, the partial erase operations occur when sufficient energy (or electric charge) is stored in a capacitor of an energy harvester to power a partial erase operation; intervals 204 may represent charging time intervals during which energy is accumulated by the capacitor.

By breaking up the flash erase operation into a plurality of partial erase operations 202, the flash may be reliably erased once a predetermined number of partial erase operations have been performed and completed (or, alternatively, once a total predetermined time duration of erase operation has been performed and completed). Because each partial erase operation has a shorter duration 206 than the duration 220 of the full flash erase operation, the amount of energy needed to perform each partial erase is lower than the amount of energy needed to perform a full flash erase operation.

In some embodiments, a flash memory may be used as a buffer to store a number as part of a NONCE authentication. The flash memory generally has a fixed size, such that a predetermined number of most recent NONCE values are stored in the buffer. Portions of the buffer storing older NONCE values (in excess of the predetermined number) can be erased to create storage space for new NONCE values. In the example, the flash memory may include at least two pages of memory each including a predetermined number of storage locations (e.g., memory words). The flash memory may store new NONCE values in a first page of memory while a second page of memory storing old NONCE values is being erased. The first page of memory may be filled over a number of memory write operations or cycles, while the second page of memory may be erased over a number of partial erase operations or cycles. In order for the second page of memory to be fully erased in the same number of cycles (or a lower number of cycles) as needed to fill the first page of memory, the number of partial erase operations needed to fully erase the second page may need to be equal to (or lower than) the number of cycles over which the first page of memory is filled. In some embodiments the number of partial erase cycles N needed to fully erase a page of flash memory is less than or equal to the page size in words P divided by the number of words M written at each power cycle.

In some embodiments first and second flash pages are allocated for data storage. Data is written to the first page and the second page is erased through a plurality of partial erase cycles. In some embodiments a partial erase cycle is performed on the second page every time the first page is written until the first page is full at which time the second page is fully erased. Then the second page is written and the first page is erased through a plurality of flash erase cycles until the second page is full. In general, a counter can be used to keep track of the number of partial erase cycles that the second page has undergone (and/or of the total time duration of partial erase operations that the second page has undergone), so as to determine whether the second page has undergone the predetermined number of partial erase cycles needed to fully erase the data stored therein (or the predetermined total time duration of partial erase operations needed to fully erase the data stored therein). However, if the number of partial erase cycles needed to fully erase the data stored in the second page is equal to the number of write cycles for filling the first page of memory, and if a partial erase cycle is performed on the second page for each write cycle performed on the first page, a counter is not required. Instead, the second page can be implicitly determined to have undergone the predetermined number of partial erase cycles when the first page of memory is full.

In some embodiments erasure of the nonvolatile memory relies on startup of a charge pump to attain a voltage higher than the maximum normal voltage available on chip. Since a charge pump usually takes some time to reach the desired voltage the sum of the partial erasure time durations 206 needed to erase a page of memory may need to be longer than the duration 220 of a flash erase operation performed to erase the page of memory all at once.

Proper erasure of flash memory is needed to ensure that stored data remains valid and reliable. Insufficient erasure of a flash memory cell may result in memory corruption. Excess erasure may damage the flash memory or result in a reduced number of allowable write/erase cycles. In some embodiments the flash memory design has a specification for a minimum and a maximum erasure time. In some embodiments the flash memory design has a specification for a typical erasure time. In some embodiments the duration of the partial erase operation in conjunction with a design specification is used to calculate the number of partial erase cycles needed for proper operation and erasure of a page (or other portion) of the flash memory. Startup time and shutdown time of the charge pump and other circuit components involved in the erasure operation may also be included in the calculation of the total partial erase duration (i.e., the total time duration corresponding to the sum of partial erase time durations 206) and/or the number of partial erase cycles needed for full erasure of a page of flash memory.

In some embodiments partial erase operations 202 are of fixed duration 206, such that all partial erase durations 206 in a partial erase operation 202 have the same fixed time duration. In some embodiments partial erase operations are of a variable duration, such that different partial erase durations 206 in a partial erase operation 202 may have different time durations. Having a variable duration of the partial erase operation is useful for applications where the amount of energy output by the energy harvester can vary. In one embodiment the energy harvester has a capacitor storage element of a known size coupled to the energy harvester output. An analog-to-digital converter (ADC) having a reference is used to measure the supply voltage (e.g., the voltage across the capacitor storage element of the energy harvester) using a voltage divider the ends of which are coupled to the supply and ground and the middle of which is coupled to the ADC input. The amount of energy available may be determined by $\frac{1}{2}*CV^2$ where C is the capacitance of the capacitor storage element and V is the supply voltage as measured by the ADC. In cases where the amount of energy stored is larger, a longer time duration 206 may be allocated to a partial erase operation. The erasure time duration 206 may be lowered or even eliminated if there is insufficient energy stored in the capacitor or energy harvester to provide the erasure operation. When a variable erasure time is used, the amount of partial erasure time performed during each partial erase operation may be written to the nonvolatile memory. Once the total accumulated partial erase time (as written in the nonvolatile memory) is sufficient, the memory is deemed to be erased.

Figure 3:
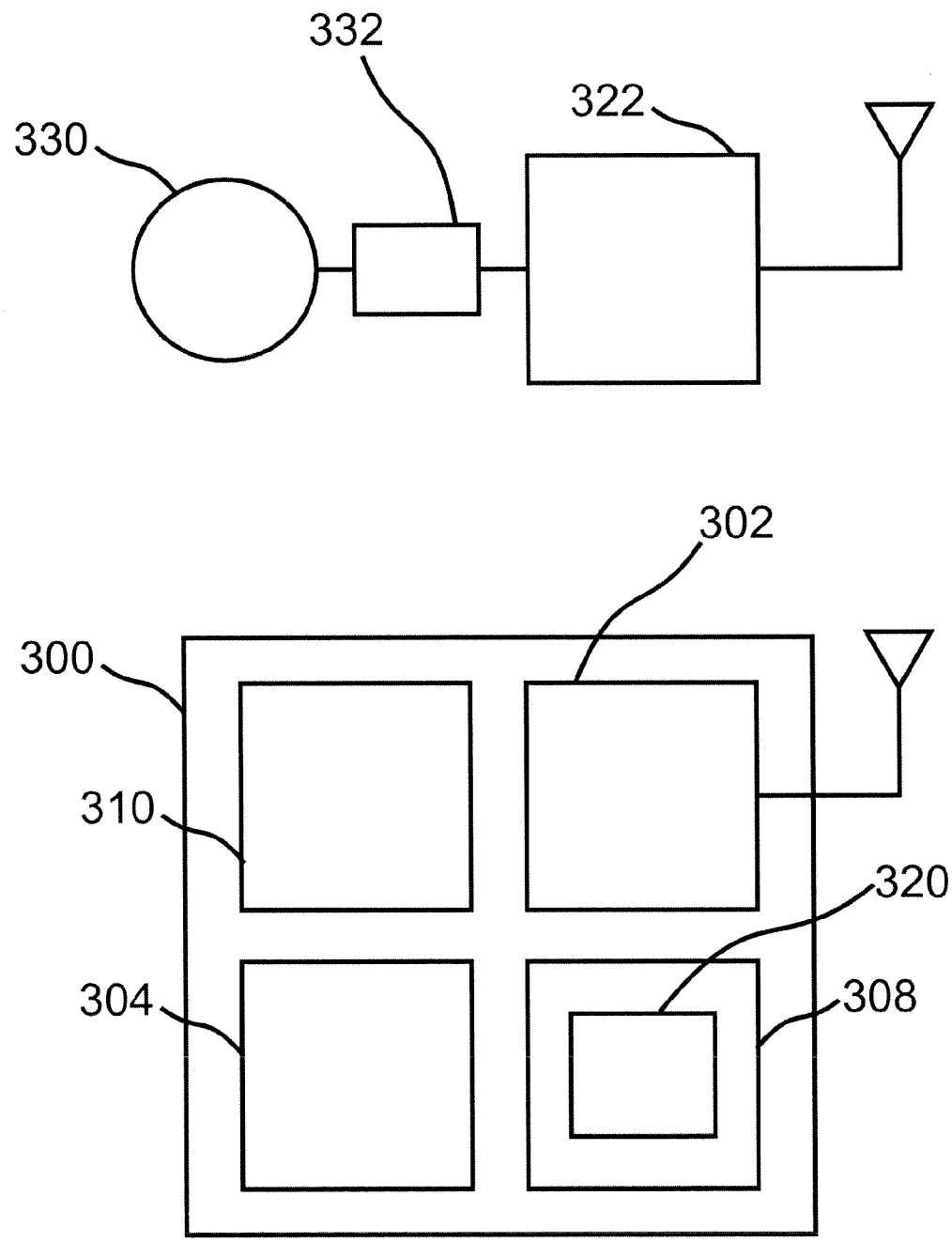
FIG. 3 is a block diagram illustrating an embodiment of a system for controlling a remote light.

FIG. 3 is a block diagram illustrating an embodiment of a system for controlling a remote light. In the example shown, system 300 is used as a ZigBee Green Power Device. System 300 includes processor 304, nonvolatile memory 310, radio transceiver 302, and energy harvester 308. Energy harvester 308 uses electrodynamic energy conversion to provide a burst of energy upon pressing button 320. The energy comes from the mechanical force applied to button 320. Upon pressing button 320 the processor is initialized, reads nonvolatile memory to determine a NONCE and transmits a packet encrypted using the NONCE via transceiver 302 to the remote node 322 via electromagnetic waves. At this point the NONCE is incremented and stored to memory. Remote node 322, which controls light 330 via controller 332, receives the packet from transceiver 302. In various embodiments controller 332 modulates the flow of line power to light 330 to adjust brightness; controller 332 switches line power on or off to light 330.

Figure 4:
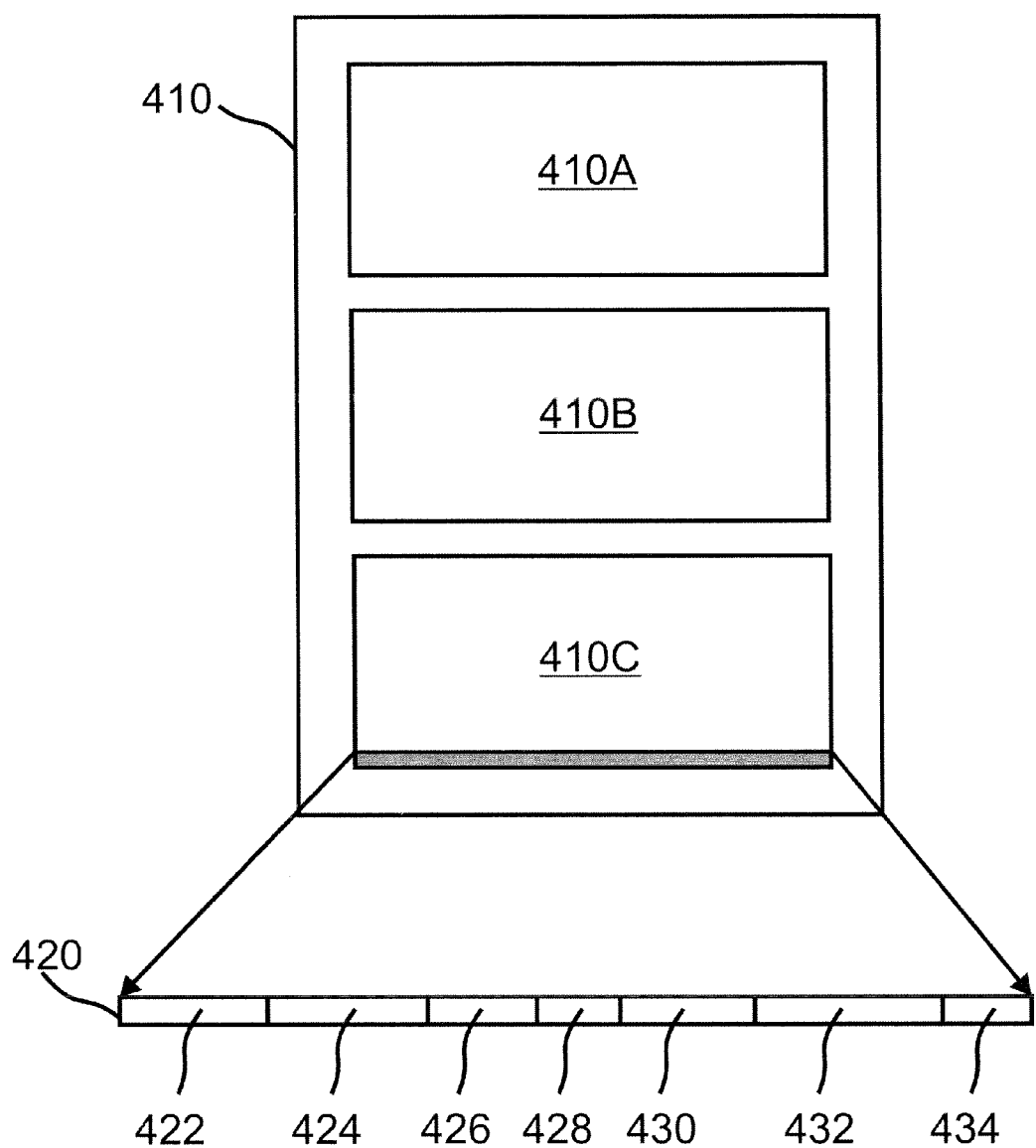
FIG. 4 is a block diagram illustrating an embodiment of a nonvolatile memory configuration.

FIG. 4 is a block diagram illustrating an embodiment of a nonvolatile memory configuration. In the example shown, the non volatile memory (which may correspond to nonvolatile memory 310 of FIG. 3) includes three pages of memory: 410A, 410B, and 410C as shown in FIG. 4. Pages 410A, 410B, and 410C constitute a circular buffer. Each page is broken up into 64 32-byte regions 420 as shown in FIG. 4. Each 32-byte region 420 comprises a NONCE value 422; a static security key 424; an attribute field 426; a network ID 428 (e.g. a pan ID); a cyclic-redundancy-check (CRC) 430; a Data Sequence Number (DSN) field 432, where the DSN field is used for filtering duplicate data packets; and a flags field 434. In various embodiments certain aforementioned fields are not part of regions 420, regions 420 include additional parameters, regions 420 are greater than 32 Bytes in size, regions 420 are less than 32 Bytes in size. Upon a button press, a region 420 of one of pages 410A, 410B, and 410C is written and a partial-erase is performed on another one of pages 410A, 410B, and 410C. At any given time, one of pages 410A, 410B, and 410C is being written, one of the pages is being erased, and one of the pages which was previously erased is "clear" and ready to be written to. In this embodiment the partial erase duration is set to a constant value equal to $\frac{1}{64}^{th}$ of the total flash erase time of 20 ms: 312.5 us. In the embodiment, each page needs 64 partial erase cycles to become erased, and each button press results in writing of a 32 byte region to a page of flash memory, such that a new page of flash memory becomes erased every time a page becomes fully written. The partial flash erase is applied to the proper page until the current page being written becomes full, thereby ensuring that the proper number of partial flash erase cycles are performed on the page being erased. By choosing the partial erase duration in conjunction with factors such as data width and page size the status of erasure may be implicitly determined to be complete when the page presently being written becomes full. Each partial erase operation is performed by starting a flash erase operation, initiating a timer (e.g., to a duration 206), and stopping the flash erase operation at the expiration of the timer. In some embodiments the timer is part of and control is performed by processor 302.

Upon application of power, the processor determines which flash page among pages 410A, 410B, and 410C is to be written, which page is being erased, and which page is clear. In some embodiments a tag (or other flag stored in memory) which is offset a known distance from the beginning of the page is used to quickly identify which page is to be written, which page is to be partially erased, and which page is clear.

Figure 5:
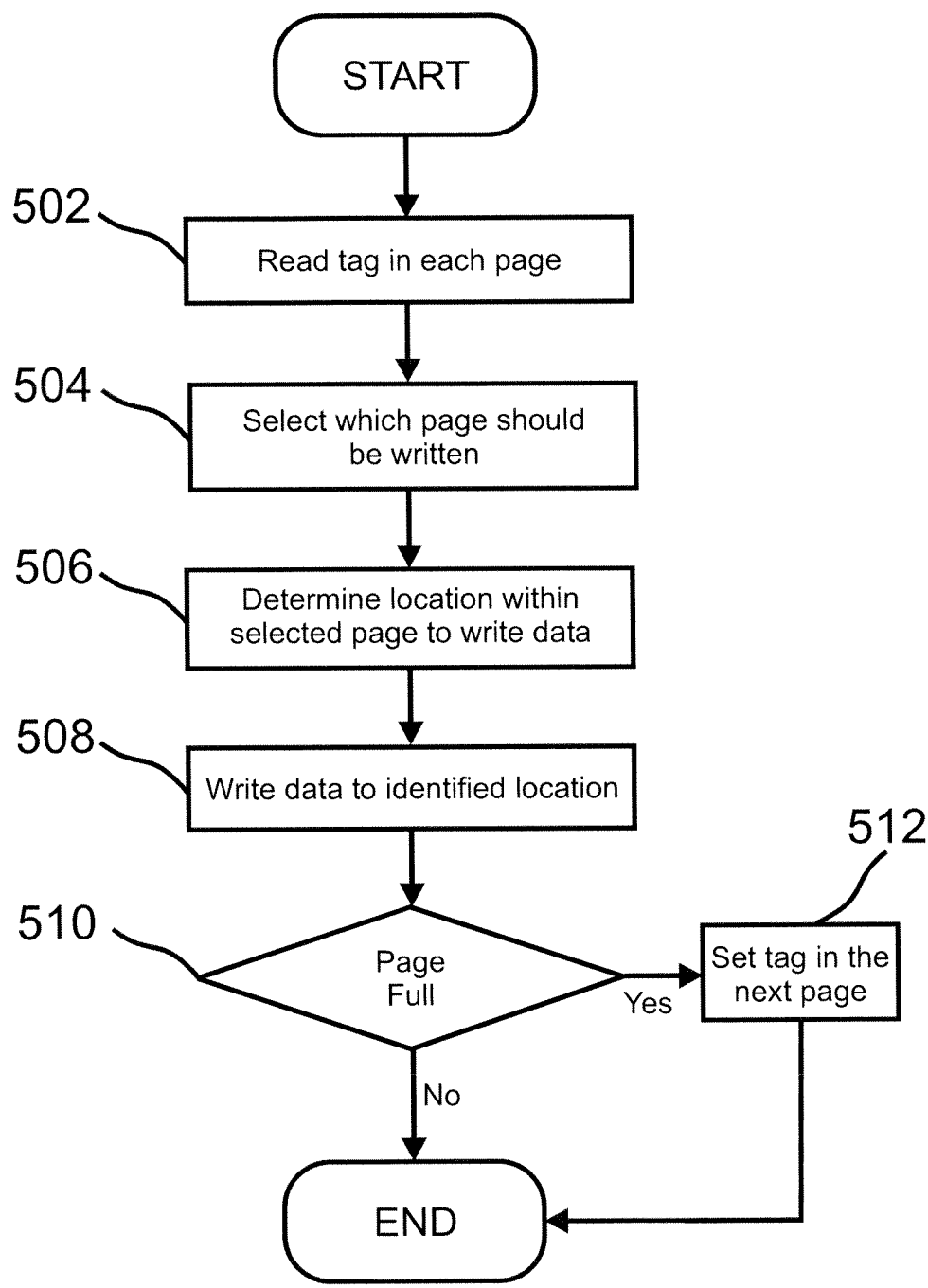
FIG. 5 is a flow diagram illustrating a process for writing to a nonvolatile memory.

Adjustments to the partial flash erase duration are made as needed to ensure that the memory is properly erased when a tag is used. In some embodiments the first bit of the page is reserved as a tag marker and is set (written to 0) when the page is the page being written. FIG. 5 is a flow diagram illustrating a process for writing to a nonvolatile memory. In the example shown, in 502 the first bit of each page is read. In 504 the page that should be written and the page that should be erased is determined. If all three bits are erased, the tag is set to 0 in page A and data is written to page A while a partial erase is applied to page C. If the tag is set to 0 on page A and erased on page B, data is written to page A and a partial erase is applied to page C. If the tag is set to 0 on page B and erased on page C, data is written to page B and partial erase is applied to page A. If the tag is set to 0 on page C and erased on page A, data is written to page C and partial erase is applied to page B. After the proper page is selected for writing, the location where data is to be written within the selected page is determined by searching the selected page for the last word written, as shown in step 506. In various embodiments a sequential search or a binary search is used to find the next available free space within the selected page. In step 508, data is written to the proper location. In step 510, the page is determined to be full or not. If the page is full (e.g., because the last word of the page was just written), then the tag in the next page is set in step 512 such that the next time data is to be written, the processor can identify the new page to be written based on the tag and thus avoid unnecessary searching of the full page for an available free storage space.

In some embodiments, the flash is never erased but a NONCE is maintained through thermometer code. The use of thermometer code allows the processor to determine a NONCE value based on the address/location of the last bit written in the nonvolatile memory. In particular, bits in the nonvolatile memory are written in address/location order each time a packet or message is transmitted using NONCE. As a result, a first bit (e.g., having address 0) in the nonvolatile memory is written when a first packet or message is transmitted using NONCE, and a second bit (e.g., having address 1) is written when a second is transmitted, etc. The NONCE value, which is also incremented each time a packet is transmitted, can thus be determined based on the address of the last written bit. For example, if the third bit (e.g., having address 2) is the last bit written in the non-volatile memory, the NONCE value can be determined from the address (e.g., NONCE=2). In some embodiments, the use of thermometer code may obviate the need for a counter to keep track of a NONCE value, and/or to keep track of a number of completed partial erase operations.

Figure 6:
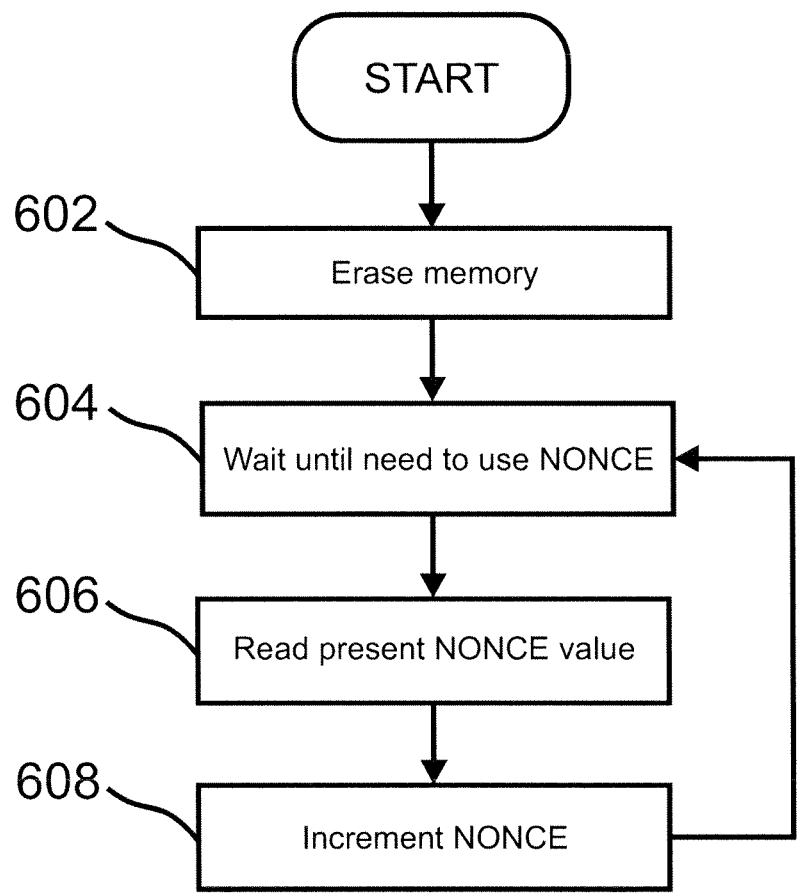
FIG. 6 is a flow diagram illustrating a process for maintaining a NONCE in a nonvolatile memory.

More generally, FIG. 6 is a flow diagram illustrating a process for maintaining a NONCE in a nonvolatile memory. In the example shown, a section of memory allocated for a NONCE counter is erased at a time of manufacture, such as final test or wafer probe, in step 602. In step 604, the flow is stopped until a NONCE is needed, for example a packet is to be transmitted using a security protocol that uses a NONCE. In step 606, the NONCE value is read by a sequential or binary search to find the last bit written in the allocated memory. The present word is the word that contains the last bit written. The value of the NONCE is determined by multiplying the address offset from the beginning of the allocated memory of the present word by the width of the words in bits, and adding to this value the bit number of the last bit written in the present word. For example, if the last bit written in the allocated memory is the third bit of the zeroth word in memory (i.e., the first word, which is numbered zero), and the memory stores 32-bit words, the value of the NONCE is equal to 0*32+3=3. In another example, if the last bit written in is the thirtieth bit of the seventh word in memory, and the memory stores 32-bit words, the value of the NONCE is equal to 7*32+30=254. In step 608, the NONCE is incremented by writing the next bit in the present word. If the present word is fully written the first bit of the next word is written instead. After the NONCE is incremented the flow proceeds back to step 604.

Figure 7:
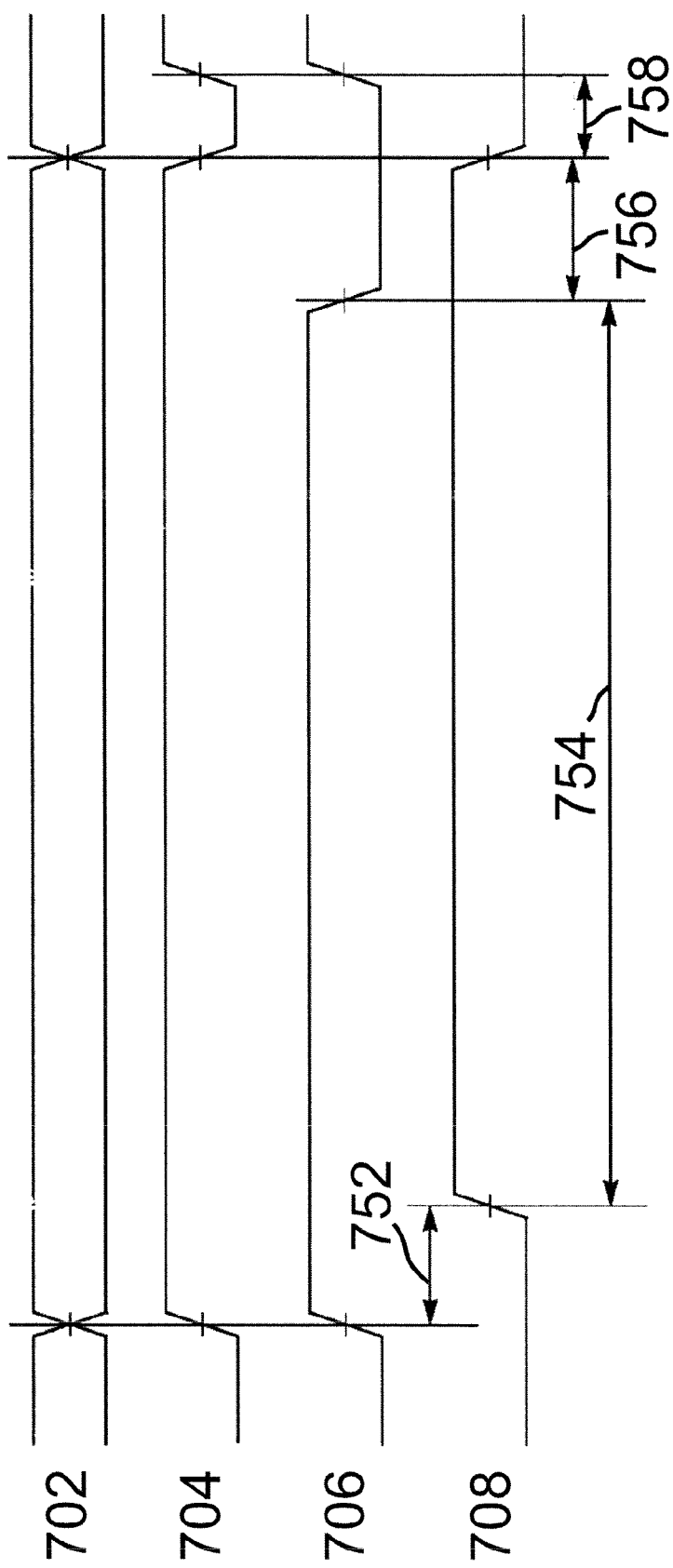
FIG. 7 is a timing diagram illustrating relative timing of signals during a flash erase operation.

FIG. 7 is a timing diagram illustrating relative timing of signals during a flash erase operation. In the example shown, a Flash memory IP block is integrated on a silicon integrated circuit with a microprocessor. X-address row select signal 702 combined with address enable signal 704 selects which page is to be partially erased. Erase-enable signal 706 in conjunction with Non-volatile store enable signal 708 causes the erase operation to commence. To ensure that the flash memory is not corrupted and to ensure that only the desired page is erased, setup and hold times denoted by reference numbers 752, 756, and 758 preferably are met. Reference number 754 indicates the active erase time during which all of the X-address row select signal 702, the address enable signal 704, the erase-enable signal 706, and the non-volatile store enable signal 708 are set to a logic high value. In some embodiments setup and hold timing of a partial erase operation is equal to the setup and hold timing of a flash erase operation; that is, the minimum setup and hold timing (periods 752, 756, and 758) needed to perform full erase operations of the flash IP may need to be met to perform a partial erase operation. This provides the benefit of reliable flash operation. The duration 754 of active erase time is controlled in a timing generator by adjusting the length time from which non-volatile store enable signal 708 goes high until when erase enable signal 706 goes low. In some embodiments adjustment of the active erase time 754 is accomplished by a timer controlled by a microprocessor. In some embodiments the microprocessor writes a register that controls a counter responsible for timing the length of 754. Maintaining the setup and hold timing associated with a flash erase operation while adjusting the active erase time to less than the time of a flash erase operation results in robust and reliable flash behavior.

In some embodiments a radio is not included for communication with a remote node. In some embodiments communication with a remote node is performed using an optical transducer such as an infrared light emitting diode, or an acoustic transducer such as a piezoelectric transducer. In some embodiments there is no communication with a remote device. In some embodiments a nonvolatile memory is included with a processor and an energy harvester, is deployed for a period of time, and is later collected for analysis of data. For example in some embodiments a temperature sensor, a processor, a nonvolatile memory, and a solar energy harvester are deployed in a shipping container; the processor initiates periodic temperature measurements and records the temperature in the nonvolatile memory to ensure the contents of the container have not been spoiled.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for erasing data stored in a nonvolatile memory, the method comprising:
    writing a number M of words of data in a first storage location of plurality of storage locations in a first page of the nonvolatile memory;

in association with the writing to the first storage location, performing during a first time period a first erase operation on a second page of the nonvolatile memory;

writing M words of data in each of at least one second storage location of the plurality of storage locations in the first page of the nonvolatile memory;

in association with the writing to the at least one second storage location, performing during at least one second time period a second erase operation on the second page of the nonvolatile memory, wherein the first time period and the at least one second time period are non adjoining time periods, wherein a duration of the first erase operation is shorter than a time duration needed to reliably erase the data stored in the second page, wherein the sum of the durations of the first time period and the at least one second time period is equal to or longer than the time duration needed to erase the data stored in the second page, and wherein an erase operation is performed on the second page every time M words of data are written to a storage location of the plurality of storage locations of the first page, the data stored in the second page is reliably erased in a number N of erase operations that is equal to or less than a ratio of the number P of words of storage space in the first page to the number M of words of data written in each writing operation such that the second page of the nonvolatile memory is determined to be reliably erased when the P words of storage space in the first page have been written to.

2. The method of claim 1, wherein:
the second page of the nonvolatile memory comprises a memory storage transistor having a charge storage layer;
the performing the first erase operation during the first time period comprises applying a voltage during the first time period between a control gate and a drain terminal of the memory storage transistor having the charge storage layer; and
the performing the second erase operation during the at least one second time period comprises applying a voltage during the at least one second time period between the control gate and the drain terminal of the memory storage transistor having the charge storage layer.

3. The method of claim 1, further comprising:
prior to the first time period and the at least one second time period, storing data in the second page of the nonvolatile memory by causing a memory storage cell of the second page to transition from a first logic state to a second logic state,
wherein the data stored in the second page is erased by causing the memory storage cell to transition from the second logic state to the first logic state.

4. A method for erasing data stored in a storage location of nonvolatile memory, the method comprising:
performing during a first time period a first erase operation on the storage location of the nonvolatile memory;
performing during at least one second time period a second erase operation on the storage location of the nonvolatile memory; and
prior to the first time period and the at least one second time period, storing data in the storage location of the nonvolatile memory by causing charge to be stored on a charge storage layer of a memory storage transistor of the storage location,
wherein:
the first time period and the at least one second time period are non adjoining time periods, a duration of the first erase operation is shorter than a time duration needed to reliably erase the data stored in the storage location,
the sum of the durations of the first time period and the at least one second time period is equal to or longer than the time duration needed to erase the data stored in the storage location, and
the performing of the first erase operation and the second erase operation comprises causing charge to be removed from the charge storage layer of the memory storage transistor;
the memory storage transistor is in a first logic state when the charge stored on the charge storage layer exceeds a threshold;
the charge stored on the charge storage layer after performing the first erase operation having the duration of the first time period exceeds the threshold; and
the charge stored on the charge storage layer after performing an erase operation having the duration of the sum of the durations of the first time period and the at least one second time period is below the threshold.

5. The method of claim 1, further comprising:
maintaining a record of a total time duration during which erase operations have been performed; and
determining that the data stored in the second page of the nonvolatile memory is reliably erased when the total time duration exceeds a predetermined time duration.

6. The method of claim 1, further comprising:
maintaining a record of a number of time periods during which erase operations have been performed; and
determining that the data stored in the second page of the nonvolatile memory is reliably erased when the recorded number of time periods exceeds a predetermined number of time periods.

7. The method of claim 1, further comprising:
powering the nonvolatile memory with an energy source having an energy output;
wherein the maximum energy output available from said energy source is less than an energy output needed to perform an erase operation having the time duration needed to reliably erase the data stored in the second page.

8. The method of claim 1, further comprising:
powering the nonvolatile memory with an energy source having an energy output;
wherein the energy output available from said energy source is more than an energy output needed to perform the first erase operation or the second erase operation having the duration of the first time period or of any of the at least one second time periods, and less than an energy output needed to perform an erase operation having the time duration needed to reliably erase the data stored in the second page.

9. The method of claim 8, wherein the energy output available from said energy source is used to power a radio device used for communication with a device located remotely from the nonvolatile memory.

10. The method of claim 1, further comprising:
prior to the first time period and the at least one second time period, storing a data value in the second ea e of the nonvolatile memory; and
generating a packet using the stored data value for transmission to a remote device via electromagnetic waves.

11. The method of claim 1 wherein the nonvolatile memory is selected from the group comprising:
Flash memory, NAND Flash memory, NOR Flash memory, a SONOS-based flash memory, a charge trap based memory technology, electrically erasable programmable read-only memory, magnetoresistive random access memory, ferroelectric RAM, and phase-change memory.

12. The method of claim 1, wherein the storage location of the nonvolatile memory comprises a page of memory.

13. A system for erasing data stored in a nonvolatile memory, the system comprising:
  a nonvolatile memory comprising storage for storing data;
  a processor coupled to the nonvolatile memory; and
  a set of instructions for execution in the processor, wherein execution of the instructions by the processor configures the system to perform functions including functions to:
    write a number M of words of data in a first storage location of a plurality of storage locations in a first page of the nonvolatile memory;
    in association with the writing to the first storage location, perform during a first time period a first erase operation on a second page of the nonvolatile memory;
    write M words of data in each of at least one second storage location of the plurality of storage locations in the first page of the nonvolatile memory;
    in association with the writing to the at least one second storage location, perform during at least one second time period a second erase operation on the second page of the nonvolatile memory,
    wherein the first time period and the at least one second time period are non adjoining time periods,
    wherein a duration of the first erase operation is shorter than a time duration needed to reliably erase the data stored in the second page,
    wherein the sum of the durations of the first time period and the at least one second time period is equal to or longer than the time duration needed to erase the data stored in the second page, and
    wherein an erase operation is performed on the second page every time M words of data are written to a storage location of the plurality of storage locations of the first page, the data stored in the seconds page is reliably erased in a number N of erase operations that is equal to or less than a ratio of the number P of words of storage space in the first page to the number M of words of data written in each writing operation such that the second page of the nonvolatile memory is determined to be reliably erased when the P words of storage space in the first page have been written to.

14. The system of claim 13, further comprising:
  an energy source for powering the nonvolatile memory and the processor, wherein:
    the second page of the nonvolatile memory comprises a memory storage transistor having a charge storage layer; and
    the function to perform the first erase operation during the first time period comprises a function to apply a voltage from the energy source during the first time period between a control gate and a drain terminal of the memory storage transistor having the charge storage layer; and
    the function to perform the second erase operation during the at least one second time period comprises a function to apply a voltage from the energy source during the at least one second time period between the control gate and the drain terminal of the memory storage transistor having the charge storage layer.

15. The system of claim 13, wherein the programming in the processor further configures the system to perform functions including functions to:
  prior to the first time period and the at least one second time period, store data in the second page of the nonvolatile memory by causing a memory storage cell of the second page to transition from a first logic state to a second logic state,
  wherein the data stored in the second page is erased by causing the memory storage cell to transition from the second logic state to the first logic state.

16. A system for erasing data stored in a storage location of a nonvolatile memory, the system comprising:
  a nonvolatile memory comprising a storage location for storing data;
  a processor coupled to the nonvolatile memory; and
  a set of instructions for execution in the processor, wherein execution of the instructions, y the processor configures the system to perform functions including functions to:
    perform during a first time period a first erase operation on the storage location of the nonvolatile memory;
    perform during at least one second time period a second erase operation on the storage location of the nonvolatile memory;
    prior to the first time period and the at least one second time period, store data in the storage location of the nonvolatile memory by causing charge to be stored on a charge storage layer of a memory storage transistor of the storage location, wherein:
      the first time period and the at least one second time period are non adjoining time periods;
      a duration of the first erase operation is shorter than a time duration needed to reliably erase the data stored in the storage location;
      the sum of the durations of the first time period and the at least one second time period is equal to or longer than the time duration needed to erase the data stored in the storage location;
      the functions to perform the first erase operation and the second erase operation comprise functions to cause charge to be removed from the charge storage layer of the memory storage transistor;
      the memory storage transistor is in a first logic state when the charge stored on the charge storage layer exceeds a threshold;
      the charge stored on the charge storage layer after performing an erase operation having the duration of the first time period exceeds the threshold; and
      the charge stored on the charge storage layer after performing an erase operation having the duration of the sum of the durations of the first time period and the at least one second time period is below the threshold.

17. The system of claim 13, wherein the programming in the processor further configures the system to perform functions including functions to:
  maintain a record of a total time duration during which erase operations have been performed; and
  determine that the data stored in the second page of the nonvolatile memory is reliably erased when the total time duration exceeds a predetermined time duration.

18. The system of claim 13, wherein the programming in the processor further configures the system to perform functions including functions to:
  maintain a record of a number of time periods during which erase operations have been performed; and determine that the data stored in the second page of the nonvolatile memory is reliably erased when the recorded number of time periods exceeds a predetermined number of time periods.

19. The system of claim 13, further comprising:
an energy source for outputting an energy output to power the nonvolatile memory and the processor,
wherein the maximum energy output available from said energy source is less than an energy output needed to perform an erase operation having the time duration needed to reliably erase the data stored in the second page.

20. The system of claim 13, further comprising:
an energy source for outputting an energy output to power the nonvolatile memory and the processor,
wherein the energy output available from said energy source is more than an energy output needed to perform the first erase operation or the second erase operation having the duration of the first time period or of any of the at least one second time periods, and less than an energy output needed to perform an erase operation having the time duration needed to reliably erase the data stored in the second page.

21. The system of claim 20, wherein the energy output available from said energy source is used to power a radio device used for communication with a device located remotely from the system.

22. The system of claim 13, wherein the programming in the processor further configures the system to perform functions including functions to:
prior to the first time period and the at least one second time period, store a data value in the second page of the nonvolatile memory; and
generate a packet using the stored data value for transmission to a remote device via electromagnetic waves.

23. The system of claim 13, wherein the nonvolatile memory is selected from the group comprising:
Flash memory, NAND Flash memory, NOR Flash memory, a SONOS-based flash memory, a charge trap based memory technology, electrically erasable programmable read-only memory, magnetoresistive random access memory, ferroelectric RAM, and phase-change memory.

* * * * *